United States Patent
Spartiotis et al.

(10) Patent No.: US 7,189,971 B2
(45) Date of Patent: Mar. 13, 2007

(54) RADIATION IMAGING DEVICE AND SYSTEM

(75) Inventors: Konstantinos Spartiotis, Espoo (FI); Kimmo Petteri Puhakka, Espoo (FI)

(73) Assignee: Oy AJAT Ltd, Espoo (FI)

( * ) Notice: Subject to any disclaimer, the term of this patent is extended or adjusted under 35 U.S.C. 154(b) by 0 days.

(21) Appl. No.: 10/154,264

(22) Filed: May 23, 2002

(65) Prior Publication Data

US 2003/0155516 A1    Aug. 21, 2003

Related U.S. Application Data

(60) Provisional application No. 60/364,248, filed on Mar. 13, 2002.

(30) Foreign Application Priority Data

Feb. 15, 2002    (FI)    .................................... 20020311

(51) Int. Cl.
*G01T 1/24*    (2006.01)

(52) U.S. Cl. .................................... 250/370.09; 438/73

(58) Field of Classification Search ............ 250/370.1, 250/370.14, 370.15, 370.08, 370.09, 332, 250/208.1, 338.4, 339.02; 438/73; 257/291, 257/443, E27.133; 348/308, 302, 98.8

See application file for complete search history.

(56) References Cited

U.S. PATENT DOCUMENTS 5,245,191 A * 9/1993 Barber et al. .......... 250/370.09

(Continued)

FOREIGN PATENT DOCUMENTS

EP    0421869    4/1991

(Continued)

OTHER PUBLICATIONS

Mescher et al., "Application Specific Flip Chip Packages: considerations ans options in using FCIP," Proc. Pan Pacific Microelectronics Symp. Conf., Jan. 2000.

(Continued)

*Primary Examiner*—Frank G. Font
*Assistant Examiner*—James P. Hughes
(74) *Attorney, Agent, or Firm*—Moetteli & Associates

(57) ABSTRACT

An x-ray and gamma-ray radiation energy imaging device has its semiconductor detector substrate and semiconductor readout/processing substrate both mounted on opposite sides of, and electrically communicating through, an intermediate substrate. The substrates are all substantially planar with the top plan perimeter of the semiconductor readout/processing substrate falling within the top plan shadow perimeter of the corresponding semiconductor detector substrate with which it electrically communicates. Additionally, all of the readout/processing circuitry contacts of the semiconductor readout/processing substrate are disposed on the surface of the semiconductor readout/processing substrate that electrically communicates with the intermediate substrate. Substantially all electrical communication to and from the semiconductor readout/processing substrate is routed through the intermediate substrate. The intermediate substrate is a printed circuit board or similar construct. The electrical contacts between the semiconductor substrates and the intermediate substrate are accomplished using bump-bonds, conductive adhesive bonds, conductive adhesive films or a combination thereof. One or two dimensional planar arrays of semiconductor readout/processing substrates and corresponding semiconductor detector substrates can be mounted on a single intermediate substrate using "tiling" techniques known in the art to form a mosaic radiation imaging device of increased active imaging area and reduced/minimized imaging dead area.

20 Claims, 16 Drawing Sheets

U.S. PATENT DOCUMENTS

| | | | |
|---|---|---|---|
| 5,379,336 A | | 1/1995 | Kramer et al. |
| 5,635,718 A | * | 6/1997 | DePuydt et al. ........ 250/370.09 |
| 5,734,201 A | * | 3/1998 | Djennas et al. ............. 257/783 |
| 5,786,597 A | * | 7/1998 | Lingren et al. ........ 250/370.09 |
| 5,812,191 A | | 9/1998 | Orava et al. |
| 5,952,646 A | | 9/1999 | Spartiotis et al. |
| 6,091,070 A | * | 7/2000 | Lingren et al. ........ 250/370.09 |
| 6,163,028 A | * | 12/2000 | Orava et al. ........... 250/370.08 |
| 6,194,715 B1 | * | 2/2001 | Lingren et al. ........ 250/370.09 |
| 6,323,475 B1 | * | 11/2001 | Spartiotis et al. ........ 250/208.1 |
| 6,356,453 B1 | | 3/2002 | Juskey et al. |
| 6,426,991 B1 | * | 7/2002 | Mattson et al. ............ 378/98.8 |
| 6,465,790 B1 | * | 10/2002 | Monnet et al. ........ 250/370.09 |
| 6,510,195 B1 | * | 1/2003 | Chappo et al. ........ 250/370.09 |
| 2001/0025928 A1 | * | 10/2001 | Lingren et al. ........ 250/370.09 |
| 2004/0178348 A1 | * | 9/2004 | Wainer et al. ......... 250/370.09 |

FOREIGN PATENT DOCUMENTS

EP      1162833      12/2001

OTHER PUBLICATIONS

Btechcorp, "ATTA(R) Anisotropic Electrically Conductive Film," http://www.btechcorp.com/aecfmain.htm, May 2002.

* cited by examiner

RADIATION IMAGING DEVICE AND SYSTEM

The present application claims the benefit of prior U.S. Provisional Application Ser. No. 60/364,248, filed 13 Mar. 2002, to which the present application is a regular U.S. National Application, and of prior filed Finland Application serial number 2002 0311, filed 15 Feb. 2002.

FIELD OF THE INVENTION

The present invention is in the field of semiconductor devices for detecting and image analyzing x-ray and gamma ray radiant energy above 1 keV. More specifically, the present invention relates to such devices wherein image analysis occurs by way of incident radiant energy on the device producing current flow between two electrically accessible points on two different semiconductor substrates separated by an intermediate substrate.

BACKGROUND OF THE INVENTION

Over the past ten years digital radiation imaging has gradually been replacing conventional radiation imaging where the recording means is film or an analog device such as an Image Intensifier. Currently, several such devices are available that can perform digital radiation imaging. In some cases, incident radiation is detected and converted locally into an electronic signal which is then collected at collection/pixel contacts and then further transmitted to readout circuits which perform various functions including digitization. In other cases, the radiation is detected and converted into light which is then converted to an electronic signal and subsequently is readout and digitized. The first cases we refer to as "direct radiation detection," and the second cases we refer to as "indirect radiation detection."

Direct radiation detection devices typically comprise a semiconductor detector substrate conductively bonded to a semiconductor readout substrate. The detector substrate is made of a photo-conductor material which converts incoming radiation into electronic signals. The readout substrate accumulates such electronic signals, processes them and reads them out. There are different kind of photo-conductor substrate technologies and different readout substrate technologies. Table I broadly summarizes various types of direct radiation digital imaging technologies, and lists typical cases in each technology group.

The following terms as used herein have their standard meaning in the electronics literature: CCD stands for Charge Coupled Device, ASIC stands for Application Specific Integrated Circuit, TFT stands for Thin Film Transistor array. Detectors are materials or devices whose response to X-ray energy is used to indicate the presence or amount of radiation incident on the detector. X-rays are electromagnetic radiation lying in a range between "cosmic rays" and "ultraviolet rays." This range is defined as lying between 0.001 and 100 angstrom units or $10^{-11}$ and $10^{-6}$ centimeters in wavelength. As used herein, the term "gamma ray" is considered to be synonymous with the term "X-ray." Gamma rays are usually considered to be produced by some natural phenomenon such as the decay of an atomic nucleus whereas X-rays are usually considered to be produced by an electronic tube or other manufactured device.

TABLE I

Radiant Energy, Direct Digital Imaging Technologies

| Technology | Detector Substrate | Readout Substrate | Substrate Interface |
|---|---|---|---|
| SBBASIC | CdTe; CdZnTe; Si; Ge; GaAs; TlBr; PbI; MgI; etc. | CMOS; BiCMOS; HBIMOS; SiGe; Mixed Signal/RF; Logic; etc. | Bump-bonds |
| a-SGTFT | a-Se; a-CdZnTe; a-CdTe; etc. | a-Si:H TFT | Epitaxial growth; Evaporation; etc. |
| a-SGASIC | a-Se; a-CdZnTe; a-CdTe; a-PbI; etc. | CMOS; BiCMOS; HBIMOS; SiGe; Mixed Signal/RF; Logic; etc.; | Epitaxial growth; Evaporation; etc. |

Abbreviations:
SBBASIC = Semiconductor Bump Bonded on ASIC;
a-SGTFT = amorphous Semiconductor Grown on TFT;
a-SGASIC = amorphous Semiconductor Grown on ASIC.

Digital radiation imaging devices utilizing SBBASIC technologies are known in the art, and typically comprise a crystalline detector semiconductor substrate (photo-conductor) and a semiconductor readout substrate incorporating integrally processed ASICs. The detector and readout substrates are joined together and electrically communicate by means of bump-bonds or other conductive means. The detector substrate has a continuous electrode on a first major face (where incident radiation impinges) and a two dimensional array of charge collecting/pixel contacts or electrodes on a second major face, opposite the first major face. Incident radiation is absorbed in the material of the detector substrate and electrical charge is generated in response to such absorption. Under the bias of an electric field between the first and second faces, the generated charge drifts toward and is collected at the charge collection/pixel contacts or electrodes. Each charge collection contact defines a separate "pixel" on the detector substrate and is conductively connected to a corresponding "pixel circuit" on the readout substrate by a bump-bond. Each pixel in combination with its corresponding pixel circuit comprises a "pixel cell." Each pixel circuit on the readout substrate may include various circuit features for amplifying, storing, digitizing, etc. the incoming charges. The bump-bonds may be accomplished using a variety of metals or compounds including various solder alloys and other conductive compositions.

Typically, at a perimeter edge of each readout substrate there is at least one region for routing input and output (I/O) signals to and from the readout substrate. These can be wire bonding pads or similar features for providing electrical connections to the ASICs of the readout substrate.

Kramer el al., U.S. Pat. No. 5,379,336, disclose a typical SBBASIC device, see FIGS. 1A and 1B. As shown in the figures, a semiconductor detector substrate 10 is bump bonded with an array of conductive bumps 13 to a readout/processing substrate 12. Both the semiconductor detector substrate 10 and the semiconductor readout/processing substrate 12 are each integral and monolithic. Examples of detector and readout/processing substrate technologies is given in Table I. Radiation hv is incident on the top (first major face) of the detector semiconductor substrate 10. A pixel array is formed by means of metal charge collection/pixel contacts on the exit face (second major face) of the detector semiconductor substrate 12. Electrical charge created in the semiconductor detector substrate 10 in response to absorption of incident radiation hv is collected by the detector pixel contacts 14. The collected charge is communicated through the conductive bumps 13 to corresponding pixel circuit contacts 15 on the readout/processing semiconductor substrate 12. The pixel circuits are used to perform a variety of possible functions including accumulating the incoming charge and/or amplifying it, discriminating, digitizing, counting incomings radiation hits, etc.

Orava et al., U.S. Pat. No. 5,812,191 and Spartiotis et al., U.S. Pat. No. 5,952,646, both disclose alternative embodiments of an SBBASIC-type digital radiation imaging devices. In these imaging devices as generally exemplified in FIG. 2, the detector semiconductor substrate 30 is electrically connected to the readout semiconductor substrate 32 with bump-bonds 35. The photo-detector material 34 of the semiconductor substrate pixels 36 absorbs incoming radiation, and in response to the absorption generates electrical charges. The electrical charges are collected at collection/pixel contacts 38, and electrically communicated through the bump-bonds 35 to the pixel circuit contacts 33 on the pixel circuit 31 of the readout semiconductor substrate 32.

However, the above noted SBBASIC imaging devices are unitary devices with an imaging area that is limited by current semiconductor manufacturing and bump-bonding technologies. At present, some of the most sensitive photoconductor materials, such as CdTe, CdZnTe, TlBr, PbI, and GaAs, can be used to manufacture single crystal semiconductor substrates without defects having dimensions of only about 3" or 4". Imaging area is even more limited with the CMOS technology typically used to create the semiconductor readout substrates. These technologies typically can produce radiation imaging devices having active imaging areas of at most a few square centimeters. Even if semiconductor substrate dimensions are increased, current bump-bonding technology would still limit the planar area of the detector and readout substrates that can be bonded together (e.g., a 10 cm×10 cm monolithic detector substrate to its readout substrate). An additional concern for the bonding of the detector and readout substrates together is the flatness of the substrates and the uniformity of the conductive bump needed to accomplish the process.

In view of these limitations, the field has been motivated to develop technologies that make it possible to industrially perform high density bump-bonding operations between single semiconductor substrate pairs. For example, "tiling" techniques have been developed in which a plurality of digital radiation imaging device units are "tiled" together in a one or two dimensional array to form a larger imaging device mosaic. Tiling of individual digital imaging devices allows production of digital radiation imaging devices having much larger imaging areas. However, tiling techniques have also introduced an amount of imaging dead area into the imaging area of the mosaic imaging device, which can adversely affect device's image quality. This imaging dead area is primarily resultant from the planar area of an individual digital imaging device tile that is required to provide the I/O connections to the individual device, e.g., the wire bonding area. Even though the depth of the wire bonding area is typically a few mm, it can create an imaging dead area that is unacceptably large for a particular radiation imaging application.

Therefore, the field has been further motivated to develop tiling techniques that reduce the amount of dead area in a mosaic or arrayed digital imaging device. FIGS. 3A and 3B illustrate an early attempt from Lemercier et al., EP 0421869, to reduce the wire bonding area 61 and other possible edge-most inactive or imaging dead areas 61a on one or two sides of an SBBASIC by overlapping some of the imaging dead areas 61 with active detector area 62 in a "stair case" arrangement of individual SBBASIC tiles. The whole "stair case" is mounted on a support 60. Although this technique does reduce the total amount of imaging dead area of an imaging device array, some perimeter dead areas 61 still remain. Additionally, in order to maximize image quality, the surfaces of all the individual SBBASIC tiles must be parallel to each other. This is mechanically difficult in the production of imaging devices like the Lemercier device. Further, the "stair case" approach required that to achieve larger the imaging areas, the support substrate 60 must be made relatively thicker in two directions.

In order to overcome the limitation of needing a double-ramped support substrate as in the Lemercier device, the field has developed alternative tiling techniques. One example shown in FIG. 4 is that of Schulman, EP 1162833, whereby imaging device tiles 56 & 58 are removably mounted on a support board. On one edge of the readout substrate 52 there is an imaging dead area 50 which extends beyond detector substrate 51 of the device tile 56 or 58 and is reserved for wire bonding. The wire bonding area is not sensitive to radiation and does not perform imaging. Each SBBASIC is mounted on a combination wedge 44 and platform 53, which in turn is mounted on a PC board 54. The wedge-platform combination allows the inactive area 50 of one imaging device tile 58 to at least partially go under the active imaging area another imaging device tile 56. This technique is complicated in its execution because the wedge-platform requires careful control of the tilt angle and precise alignment of the tile devices relative to each other. Further more, the inactive area is never completely covered and the tile angle can introduce a parallax error depending on the angle of incidence of the incoming radiation.

While the SBBASIC technology is relatively the newest approach to direct radiation digital imaging and has advantages over the other prior radiation digital imaging technologies, it also currently has certain limitations:

a. In current devices, the detector and readout substrates are manufactured with a limited field of view. Field of views of single devices of only up to 2.5 cm$^2$ have been reported. This is insufficient for most commercial applications.

b. Due to this limitation, tiling techniques that combine a plurality of SBBASIC devices have been suggested to provide a larger field of view. However, such tiling techniques can be cumbersome and difficult to implement on an industrial production scale. This can adversely impact the quality of imaging and the cost of the complete camera head comprising a plurality of such SBBASICs.

c. In addition to the limitation of (a) and (b) above, in current SBBASIC imaging devices, the interconnection of the ASIC with wire bonding pads introduces an "inactive" area for each SBBASIC device. This is an area that is not useable to image incoming radiation. Such "dead" areas adversely impact image quality, especially when they are too large to cancel them out by software.

Although each of the above radiation imaging devices may be useful for their intended purposes, it would be beneficial in the field to have an alternative radiation imaging device that eliminates or further minimizes imaging dead area due to wire bonding requirements of the ASICs involved, without requiring a support ramp. Additionally, it would be beneficial to have the semiconductor tiles mounted in the same plane. It would be further beneficial if the device can be produced using current bump-bonding techniques in combination with the new high sensitivity semiconductor materials that can be mechanically brittle and susceptible to relatively high bumping temperatures.

SUMMARY OF THE INVENTION

The present invention is a "Semiconductor Detector Via Connected to Application Specific Integrated Circuit" (SV-CASIC) type radiation imaging device. Structurally, this means that a semiconductor/photo-conductor substrate is physically bonded to an intermediate or "via" substrate, which is in turn physically bonded to a processing/readout (ASIC) substrate. Functionally, the intermediate or via substrate provides electrical communication between the photo-detector substrate and the readout substrate. Additionally, the intermediate substrate provides electrical communication between the ASICs of the readout substrate and between the present imaging device and any circuits external to the imaging device.

The present invention is an SVCASIC type x-ray and gamma-ray radiation energy imaging device comprising a semiconductor detector substrate and a readout/processor substrate which are separated by and bound to an intermediate substrate in a laminate-like configuration. The semiconductor substrates and the intermediate substrate of the present invention generally have a planar configuration and are disposed adjacent each other with their planes in a parallel. In its simplest configuration, the present radiation imaging device comprises a single detector substrate, a single readout substrate and a single intermediate substrate. However, an object of the present invention is an imaging device comprising an array of detector substrates and a corresponding array of readout substrates which are separated by and bound to a single intermediate substrate, again, in a laminate-like configuration.

The semiconductor detector substrates practicable in the present invention are known in the at. Typically, the semiconductor detector substrate has a planar configuration and two major opposing planar surfaces: an electrode surface and a pixel surface. The detector semiconductor substrate also comprises a photo-conductor material disposed between the two major surfaces. The photo-conductor material converts radiation energy impinging on the electrode surface to electrical charges within the thickness of the photo-conductor material. The detector substrate has an electric field bias acting to cause an electric charge generated within the thickness of the photo-conductor in response to absorbed radiation to drift directly toward the pixel surface of the detector substrate. An electric field bias can be accomplished by having a charge biasing electrode disposed continuously across the electrode surface of the detector substrate.

On the pixel surface of a unitary detector substrate is a plurality of pixels. The total area and configuration of the pixels define the active imaging area of the detector substrate. Preferably, the plurality of pixels have a total surface area substantially equal to the total surface area of the pixel surface. In this situation, the shadow perimeter of the unitary detector substrate is a factor in determining the relationship between image size and image quality of the final imaging device (for a given detector substrate pixel density). Each pixel has an associated charge collector electrode and contact. The pixel collector contacts are disposed in a collector contact pattern on the pixel surface of the detector substrate. The pixel electrodes/contacts collect drifting electrical charges generated within the detector substrate.

The semiconductor readout/processing substrates practicable in the present invention are generally known in the art. Typically, a semiconductor readout substrate comprises at least one application specific integrated circuit (ASIC), and has a planar configuration and two major opposing planar surfaces. One of the major surfaces is a readout surface, which is disposed opposite the pixel surface of the detector substrate. The ASIC readout substrate further comprises a plurality of pixel circuits, each pixel circuit having an electrical transmission contact processed onto the readout surface of the ASIC semiconductor readout substrate. The transmission contacts are the inputs to the pixel circuits of the ASIC readout substrate. The electrical transmission contacts are disposed in a transmission contact pattern.

Additionally, the semiconductor ASIC readout/processing substrate of the present invention has a plurality of electrical I/O contacts processed onto the readout surface of the ASIC semiconductor substrate. The I/O contacts are the input and output electrical contacts for the ASIC(s) of the semiconductor readout substrate, and are disposed in an I/O contact pattern.

The intermediate substrate is disposed between the semiconductor detector substrate and the ASIC semiconductor readout substrate. Typically, the intermediate substrate has a planar configuration and two major opposing planar surfaces: an entry face disposed adjacent the pixel surface of the detector substrate, and an exit face disposed adjacent the readout surface of the ASIC readout substrate. A plurality of discrete conductive via passages provide discrete electrical communication paths between the entry and exit faces through the thickness of the intermediate substrate. The via passages have a first end at the entry face disposed in an entry passage pattern (corresponding to the pixel pattern of the detector substrate) and a second end at the exit face disposed in an exit passage pattern (corresponding to the transmission contact pattern of the readout substrate). Additionally, a plurality of wire contacts are disposed on the exit face in a wire contact pattern corresponding to the I/O contact pattern on the readout surface of the ASIC semiconductor readout substrate. The wire contacts are in electrical communication with wire bonding pads mounted on a peripheral edge of the intermediate substrate.

The conductive via passages are apertures or holes through the thickness of the material of the intermediate substrate. The via passages have a lining comprised of an electrically conductive material (e.g, Copper, Gold, Silver, Nickel, Aluminum, Platinum, Lead, Tin, Bismuth and Indium or combination thereof) to make the passage conductive. Alternatively, the via passages are filled with a conductive material (e.g., solder) to make the passages conductive. Optionally, the conductive via passages can each electrically communicate with a discrete conductive skirt at the end of passage on at least one of the faces of the intermediate substrate. The skirt can be separately processed on to the face of the intermediate substrate using circuit substrate technologies known in the art, and can be integral with the via passage conductive lining. The intermediate substrate itself can be make of any of a variety of materials known in the art, such as: a printed circuit board, a photo-resist material, an F4 material, and a ceramic material.

Optionally, the wire contacts of the intermediate substrate can be recessed into the exit face of the intermediate substrate, and the recesses lined or filled with a conductive material as are the via passages. This allows an electrical pathway communicating with a wire contact run through the thickness of the intermediate substrate and to be insulated from either entry face or the exit face.

The semiconductor substrates (i.e., the detector/photo-conductor substrate and the ASIC readout substrate) are each bonded to the appropriate face of the intermediate substrate—the detector substrate to the entry face and readout substrate to the exit face. This is accomplished by electrically conductive bonds discretely connecting each pixel contact in the pixel pattern of the detector substrate to the first end of the corresponding conductive via passage of the entry passage pattern on the entry face of the intermediate substrate. Similarly, electrically conductive bonds discretely connect each transmission contact in the transmission contact pattern of the readout substrate to the second end of the corresponding conductive via passage of the exit passage pattern on the exit face of the intermediate substrate. Additionally, electrically conductive bonds discretely connect each I/O contact in the I/O contact pattern of the readout surface of the readout substrate with the corresponding wire contact in the wire contact pattern on the exit face of the intermediate substrate.

Bonding techniques practicable in the present invention are known in the art. Conductive bonding of the various electrical contacts of the semiconductor substrates to the intermediate substrate is readily accomplishable in the present invention by one of ordinary skill in the art. For example, such bonding can be accomplished using bump-bonds or conductive adhesives, especially anisotropic conductive adhesives. See Mescher et al., *Application Specific Flip Chip Packages: Considerations and Options in Using FCIP*, Proc. Pan Pacific Microelectronics Symp. Conf., January 2000; Juskey et al., U.S. Pat. No. 6,356,453; and Btechcorp., ATTA® *Anisotropic Electrically Conductive Film*, http://www.btechcorp.com/aecfimain.htm, May 2002.

The architecture of the present invention utilizing an intermediate substrate as a mounting platform for the semiconductor substrates accomplishes several benefits desirable in a radiation imaging device. One of the benefits is the potential for producing larger area imaging devices with improved image quality relative to some prior devices by reducing or minimizing the amount of imaging dead area in the device. This is accomplished by having an entire ASIC readout substrate, including its I/O contacts, disposed within the "perimeter shadow" of its associated detector substrate. In this configuration, the ASIC readout substrate has no perimeter edge extending beyond the perimeter shadow of the detector substrate. Therefore, unitary detector substrates may be close packed using tiling techniques to form a mosaic imaging device that has minimized imaging dead area, because the underlying unitary readout substrates themselves do not have an imaging dead area.

Another potential benefit is the facilitation of production of radiation energy imaging devices that utilize semiconductor substrates which are sensitive to the temperatures and pressures of certain prior semiconductor radiation imaging device manufacture methods and technologies. For example, in situations where the semiconductor substrate is brittle, or is comprised of temperature sensitive materials, such detector substrates comprises Cadmium and/or Tellurium. This is particularly the case where solder bump-bonding is to be used to bond the conductive contacts of the semiconductor substrates. By initially applying the solder bumps to the conductive contacts on the intermediate substrate, the semiconductor substrates are not exposed to the sometimes harsher conditions required to initially make bumped contacts. The intermediate substrate is not a semiconductor substrate, and may be made of relatively more rugged materials as selectable by one of skill in the art to withstand the initial bumping conditions. Once the conductive contacts on a face of the intermediate substrate are bumped, conductive bonding to the corresponding conductive contacts of a sensitive semiconductor substrate may be accomplished using the potentially less harsh conditions of solder reflow techniques.

The present invention includes a method of producing a radiation energy imaging device by providing an intermediate substrate of the type detailed above, and applying solder or other conductive bumps to the conductive contacts (i.e., the via passages and any wire contacts) on a face of the intermediate substrate to provide an intermediate substrate face with bumped contacts. Then the appropriate semiconductor (detector or readout) substrate is placed in juxtaposition with the intermediate substrate face with solder bumped contacts, with the solder bumped contacts closely proximate or touching the corresponding contacts on the semiconductor substrate. Next the intermediate and semiconductor substrates are bonded together by causing the solder of the solder bumped contacts to reflow under appropriate conditions of heat and pressure to form solder bump-bonds between the solder bumped contacts of the intermediate substrate and the corresponding contacts on the semiconductor substrate. If conductive bumps made of a material other than solder are used, then the appropriate application of temperature and pressure for that material is used to cause the formation of the bump-bonds. Alternatively, the conductive bumps may be initially applied to the semiconductor substrate, if the susceptibility of the semiconductor material is not controlling.

In an alternative method of bonding the semiconductor substrates to the intermediate substrate, conductive adhesives can be used. For example, an conductive adhesive can be applied to the conductive contacts on one or both faces of the intermediate substrate or to the conductive contacts on the semiconductor (detector and/or readout) substrates or to both, to provide conductive adhesive coated contacts. Optionally, an anisotropically conductive adhesive film can be applied between the surfaces and/or faces of the semiconductor and intermediate substrates, including all of the conductive contacts of the substrates. The semiconductor substrates can then be bound to the intermediate substrate in a manner similar to that detailed above for bump-bonding, or otherwise known to one of ordinary skill in the art.

DETAILED DESCRIPTION OF THE INVENTION

Figure 1A:
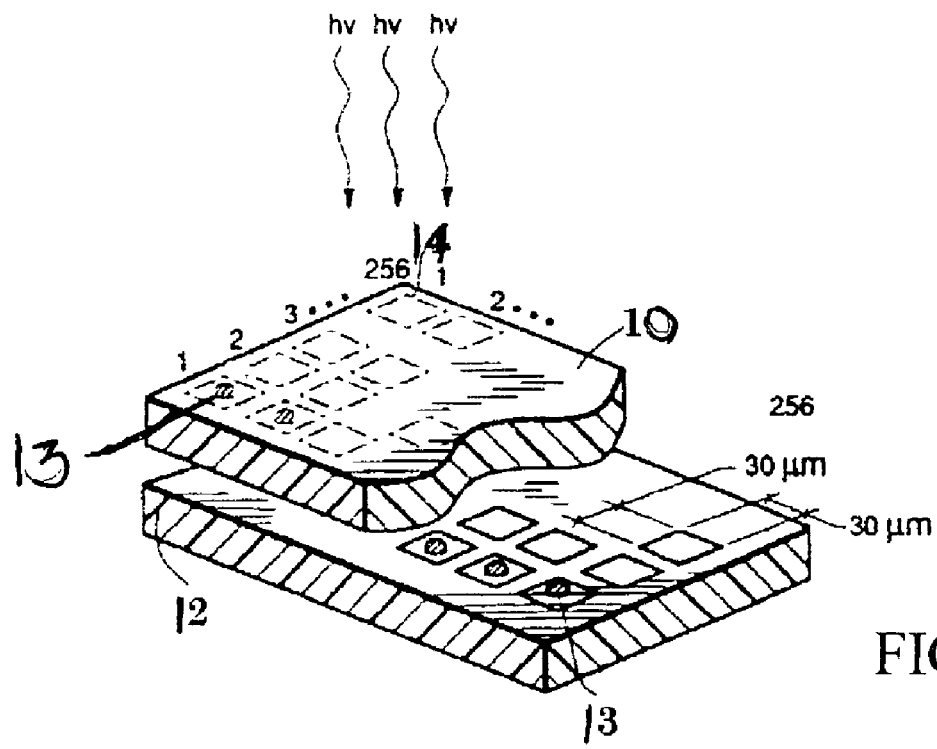
FIG. 1A is a perspective illustration of a prior art SBBA-SIC-type radiation digital imaging device having bump-bonded detector and readout substrates.
Figure 1B:
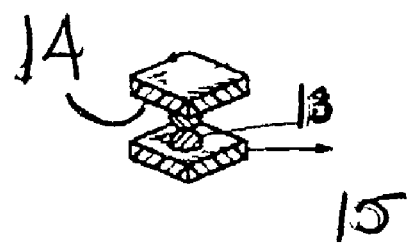
FIG. 1B is close up perspective view of a single pixel cell of FIG. 1A.
Figure 2:
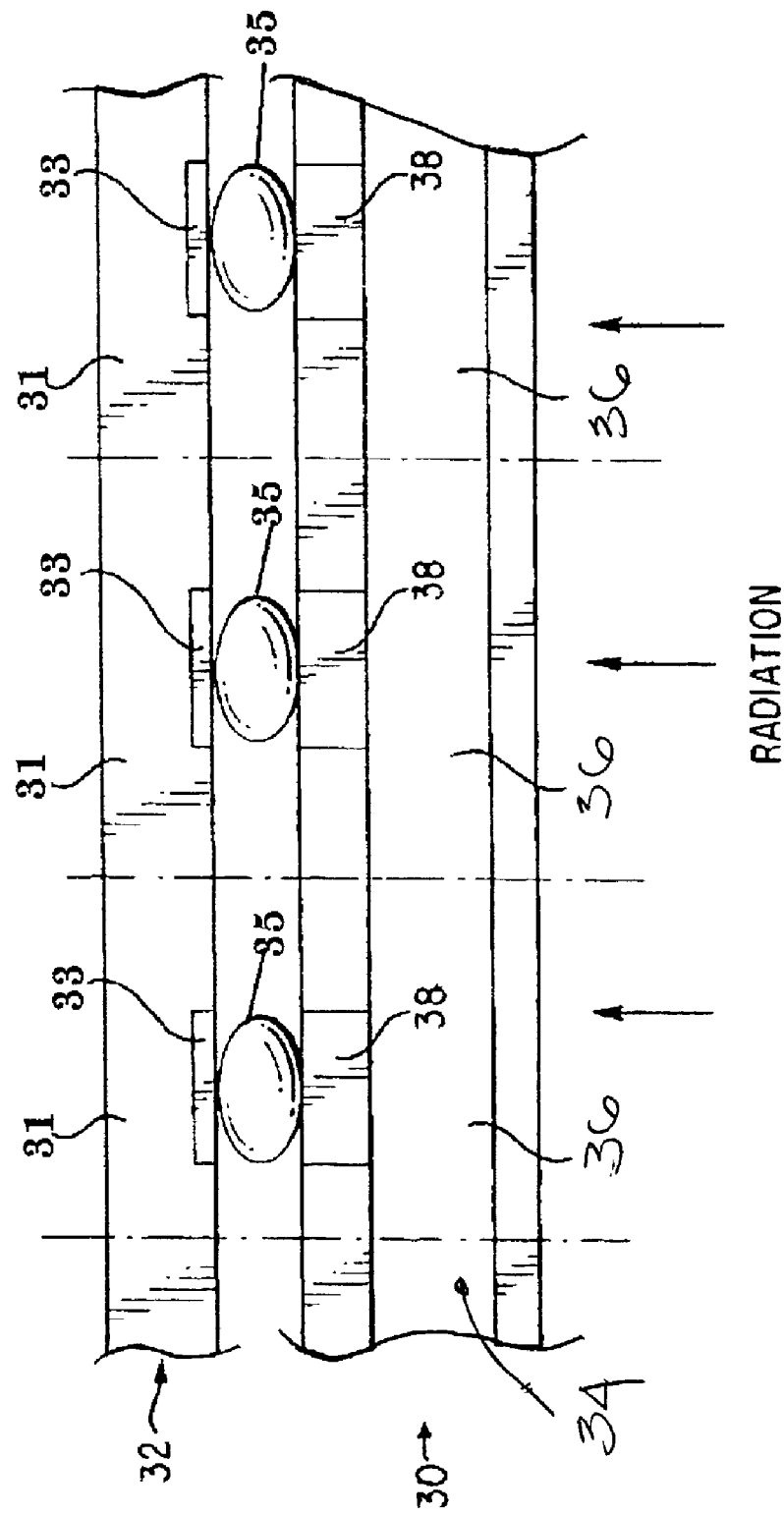
FIG. 2 is a cross-sectional view of a prior alt SBBASIC-type semiconductor radiation imaging device.
Figure 3A:
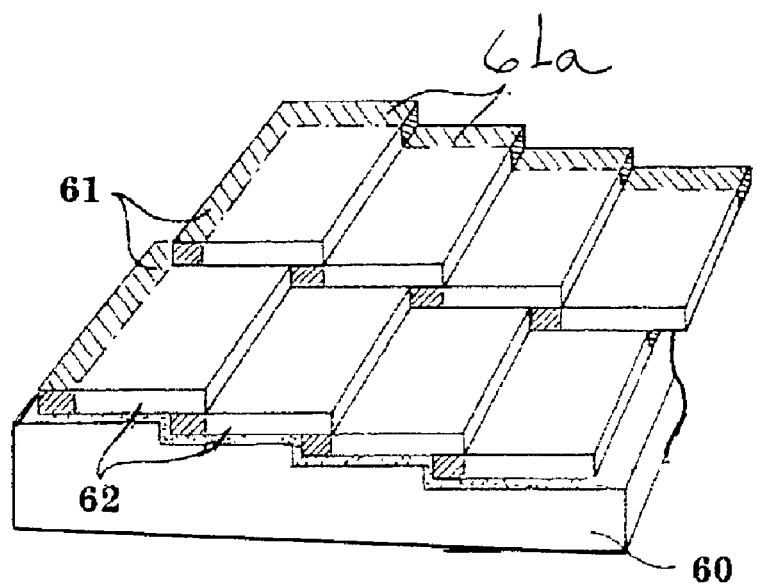
FIGS. 3A and 3B respectively are a perspective view (A) and a side view (B) representation of a prior art mosaic radiation imaging device where individual imaging devices (tiles) are arrayed in two dimensions in order to provide an increased image area imaging device.
Figure 3B:
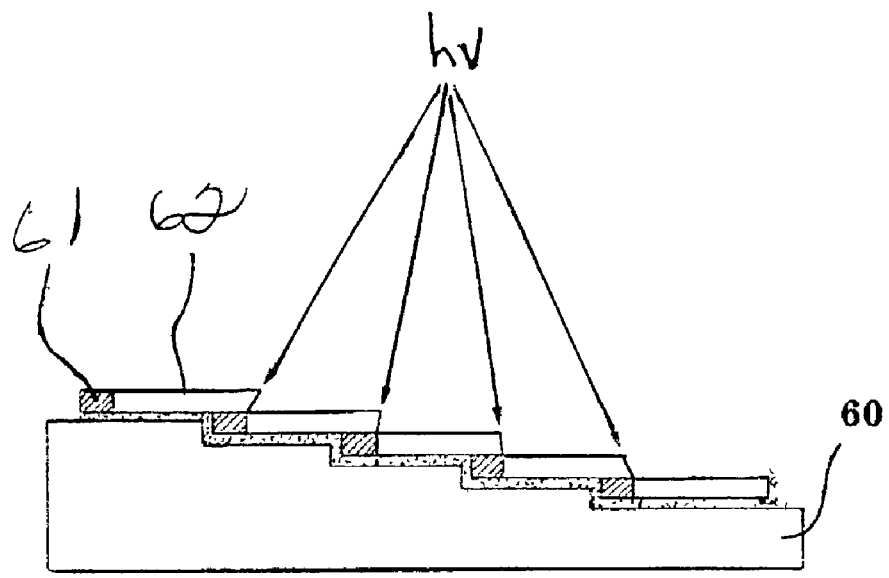
Figure 4:
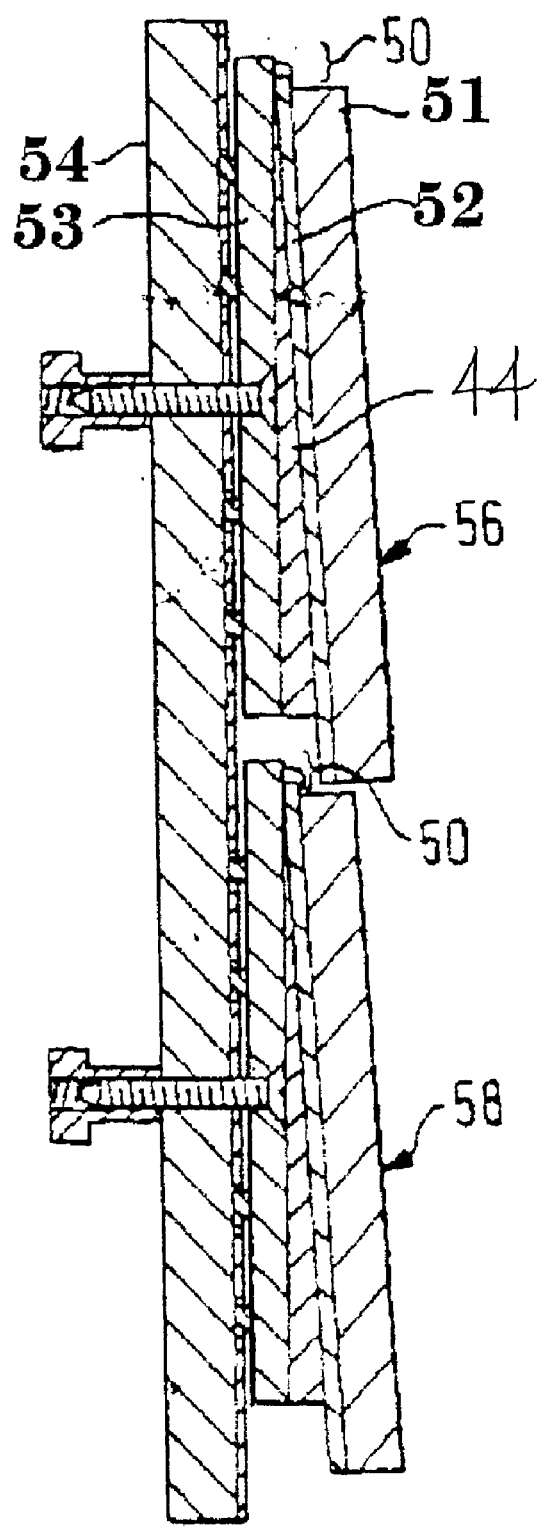
FIG. 4 is a side view representation of a prior art mosaic radiation imaging device where individual imaging devices (tiles) are arranged to have the active imaging area of one imaging device or tile overlap the imaging dead area of another imaging device tile.

Referring now to the drawings, the details of preferred embodiments of the present invention are graphically and schematically illustrated. Like elements in the drawings are represented by like numbers, and any similar elements are represented by like numbers with a different lower case letter suffix.

Figure 5A:
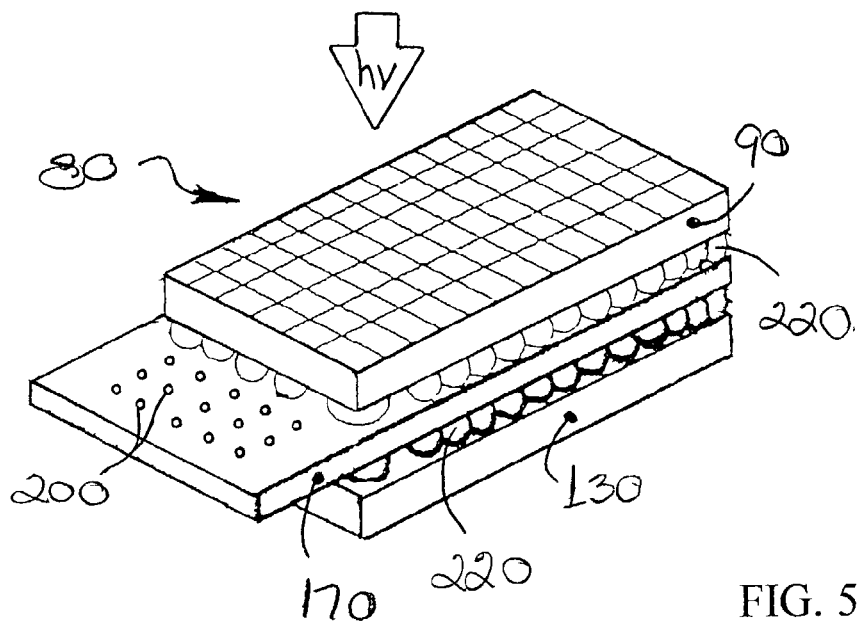
FIG. 5 is a schematic representation of a device of the present invention comprising unitary detector and readout semiconductor substrates, mounted in a laminate or layered configuration on a single intermediate or "via" substrate.
Figure 5B:
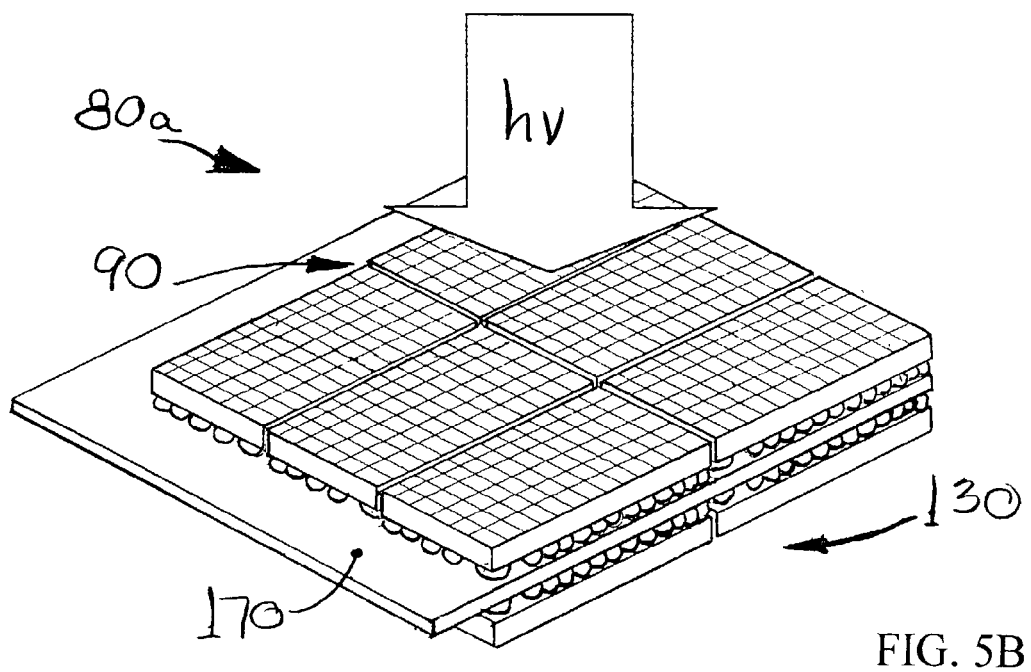

As exemplified in FIG. 5A, in a preferred embodiment, the present invention is a SVCASIC type digital imaging device 80 for imaging x-ray and gamma-ray radiation energy preferably in the energy range of 1 keV to 500 keV. The digital SVCASIC imaging device 80 comprises two semiconductor substrates, a detector substrate 90 and a readout/signal processing substrate 130, separated by and bonded to an intermediate substrate 170. The substrates 90, 130 & 170 have a substantially planar configuration and are disposed adjacent each other with their planes in a parallel to form a laminate structure in the assembled imaging device 80. In an alternative preferred embodiment exemplified in FIG. 5B, the radiation energy imaging device 80a comprises a plurality of detector substrates 90 and a plurality of ASIC readout substrates 130 bonded to a single intermediate substrate 170.

Figure 6A:
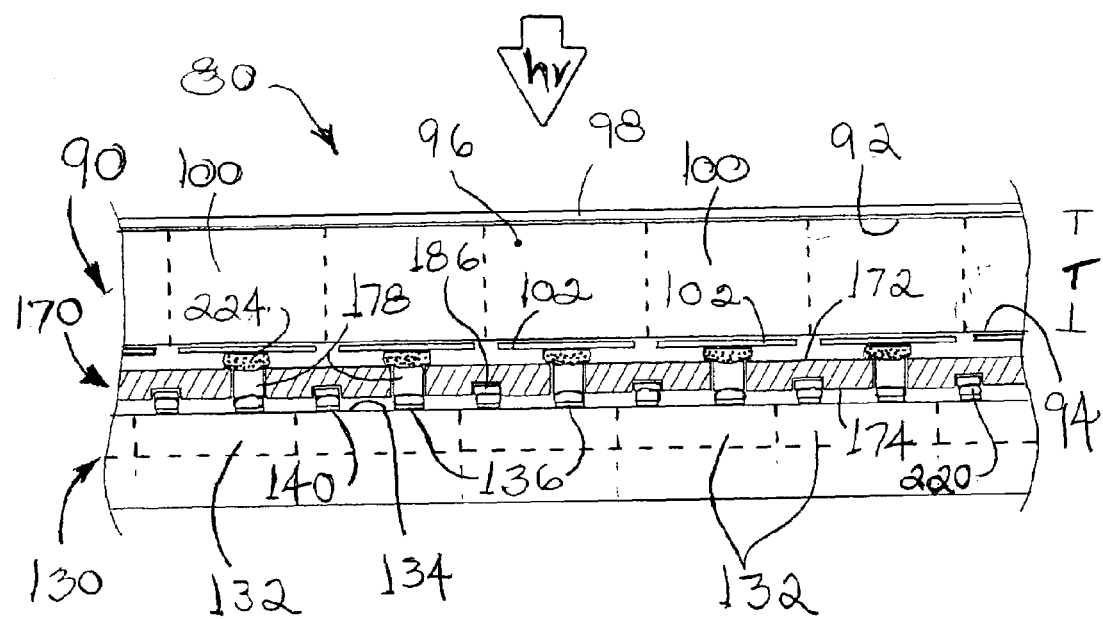
FIGS. 6A and 6B are a side view schematic representation of a device of the present invention showing the relationship between the detector and readout substrates to the intermediate substrate. The intermediate substrate is in cross section to show the relationship of the various electrical contacts between the substrates.
Figure 6B:
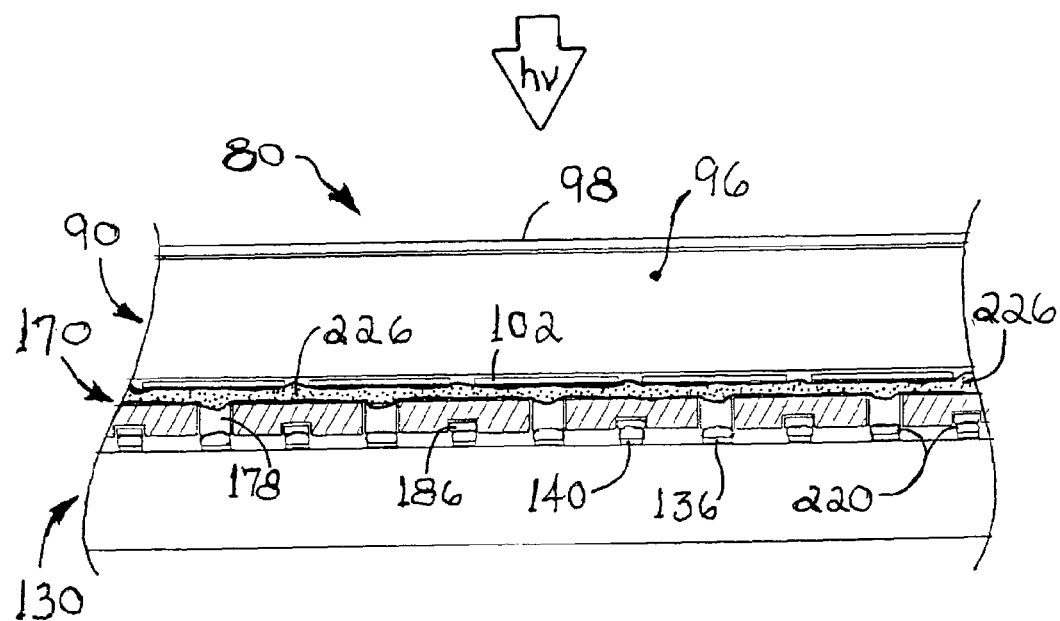

In a preferred embodiment as exemplified in FIGS. 6A and 6B, the semiconductor detector substrate 90 has a planar configuration and two major opposing planar surfaces: an electrode surface 92 and a pixel surface 94. The thickness T of the detector substrate 90 is comprised of a photo-conductor 96, such as are known in the art, including CdTe, CdZnTe, PbI, TlBr, HgI, Ge, GaAs, Si, and others. Radiation energy hv impinging on the electrode surface 92 is absorbed by the photo-conductor 96 and converted to electrical charges (not shown). Under the influence of an electric field bias (not shown), the electric charges generated within the thickness T of the photo-conductor 96 in response to absorption of the impinging radiation hv are caused to drift directly toward the pixel surface 94 of the detector substrate 90. An electric bias field can be accomplished by any of a number of means known to one of ordinary skill in the art. However, in the embodiment illustrated, a charged biasing electrode 98 is disposed continuously across the electrode surface 92 of the detector substrate 90. The electrical charge on the biasing electrode 98 creates the electric bias field which causes the drift of the electrical charges toward the pixel surface 94. The biasing electrode 98 is substantially transparent to the impinging radiation hv.

Figure 7A:
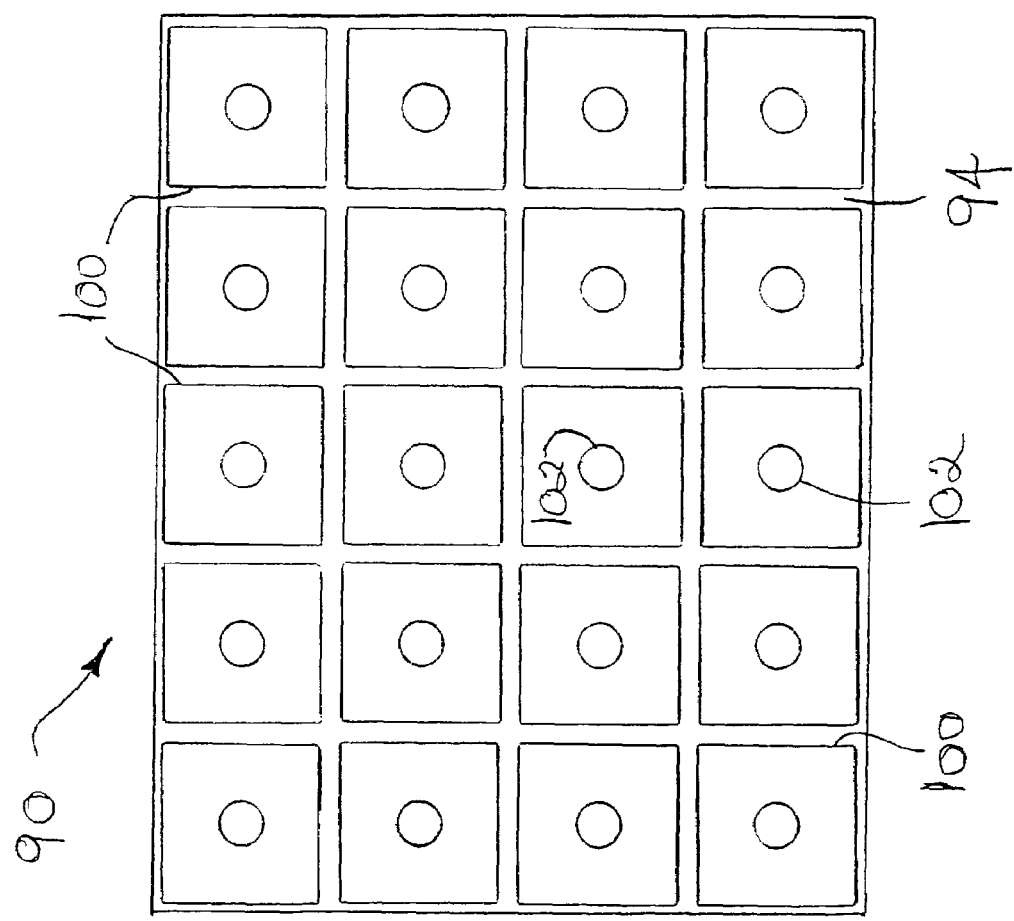
FIG. 7A is a schematic illustrating the pixel surface of an exemplary semiconductor detector substrate.
Figure 7B:
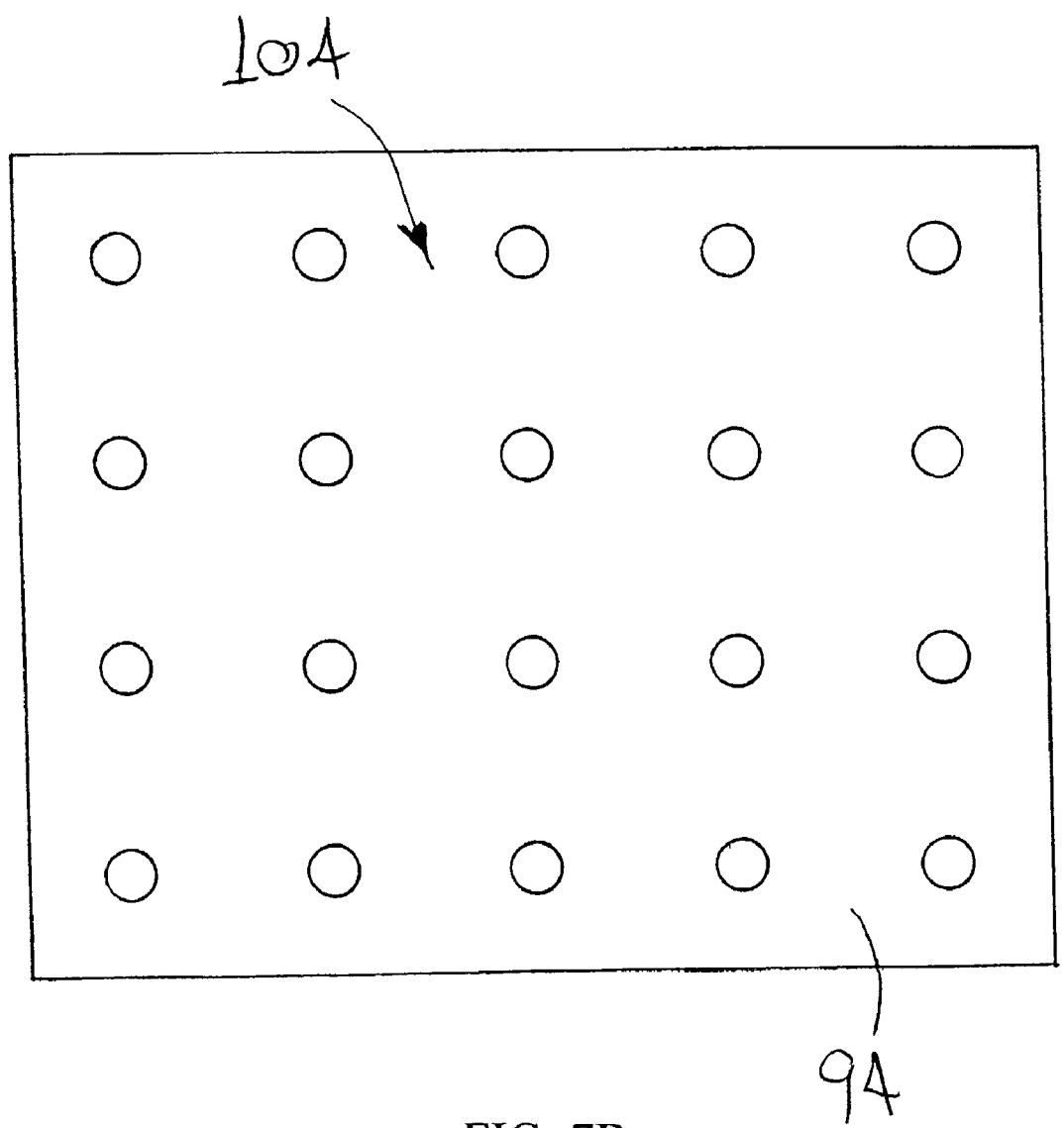
FIG. 7B is a schematic illustrating the pixel contact pattern on the pixel surface of the exemplary semiconductor detector substrate of FIG. 7A.

As exemplified in FIG. 7A, a plurality of pixels 100 and associated pixel collector electrodes/contacts 102 are disposed on the pixel surface 94 of the detector substrate 90. Each pixel collector electrode/contact 102 corresponds to an individual pixel 100. The pixel collector electrodes/contacts 102 are electrically conductive contacts for collecting the electrical charges generated in their associated pixels 100 by the absorption of radiation hv. The pixel collector contacts 102 are arranged in a pixel contact pattern 104 (see FIG. 7B).

Figure 8A:
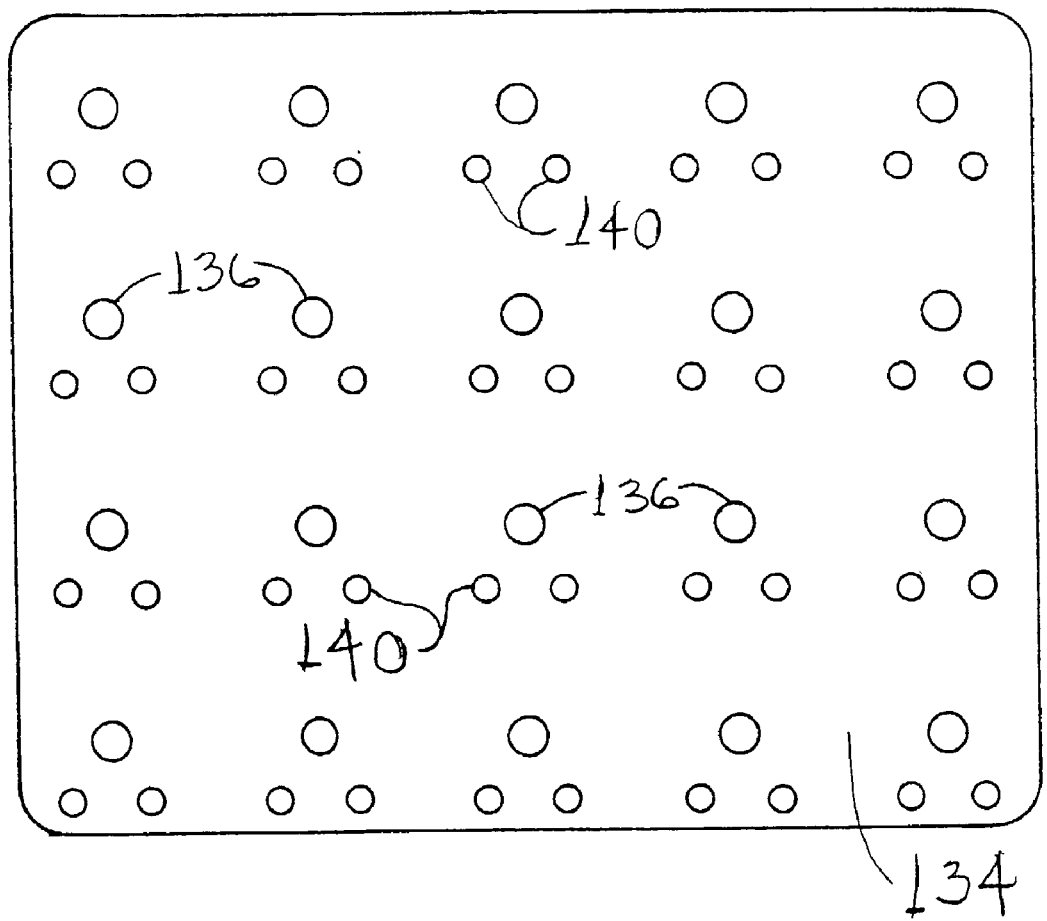
FIG. 8A is a schematic illustrating the readout surface of an exemplary semiconductor ASIC readout substrate.
Figure 8B:
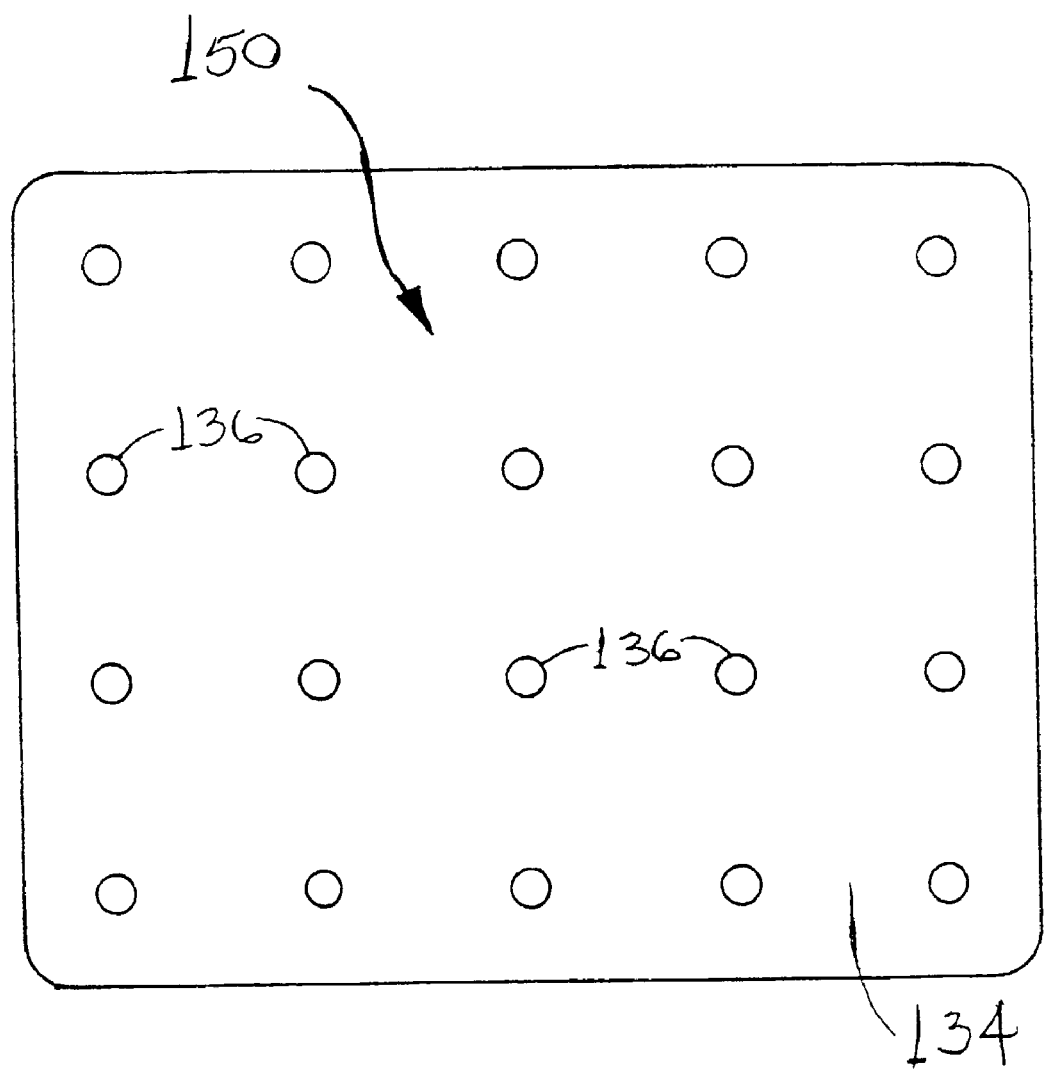
FIG. 8B is a schematic illustrating the transmission contact pattern on the readout surface of the exemplary semiconductor readout substrate of FIG. 8A.

As exemplified in FIG. 8A, in the preferred embodiment, the semiconductor ASIC readout substrate 130 comprises a plurality of ASIC pixel circuits 132. Additionally, the ASIC readout substrate 130 has a readout surface 134, which in the assembled imaging device 80 is disposed opposite the pixel surface 94 of the detector substrate 90 (also see FIG. 6A). Each pixel circuit 132 includes an electrical transmission contact 136 processed on the readout surface 134 of the semiconductor readout substrate 130. Each transmission contact 136 is the input to pixel circuit (processing/readout cell) 132. The ASIC processing/readout substrate 130 comprise one or more ASICs, preferable created with CMOS or other available ASIC processes. The transmission contacts 136 are the electrical charge radiation signal inputs to their respective pixel circuit 132 of the ASIC readout substrate 130. The transmission contacts 136 are arranged in a transmission contact pattern 150 (see FIG. 8B).

Figure 8C:
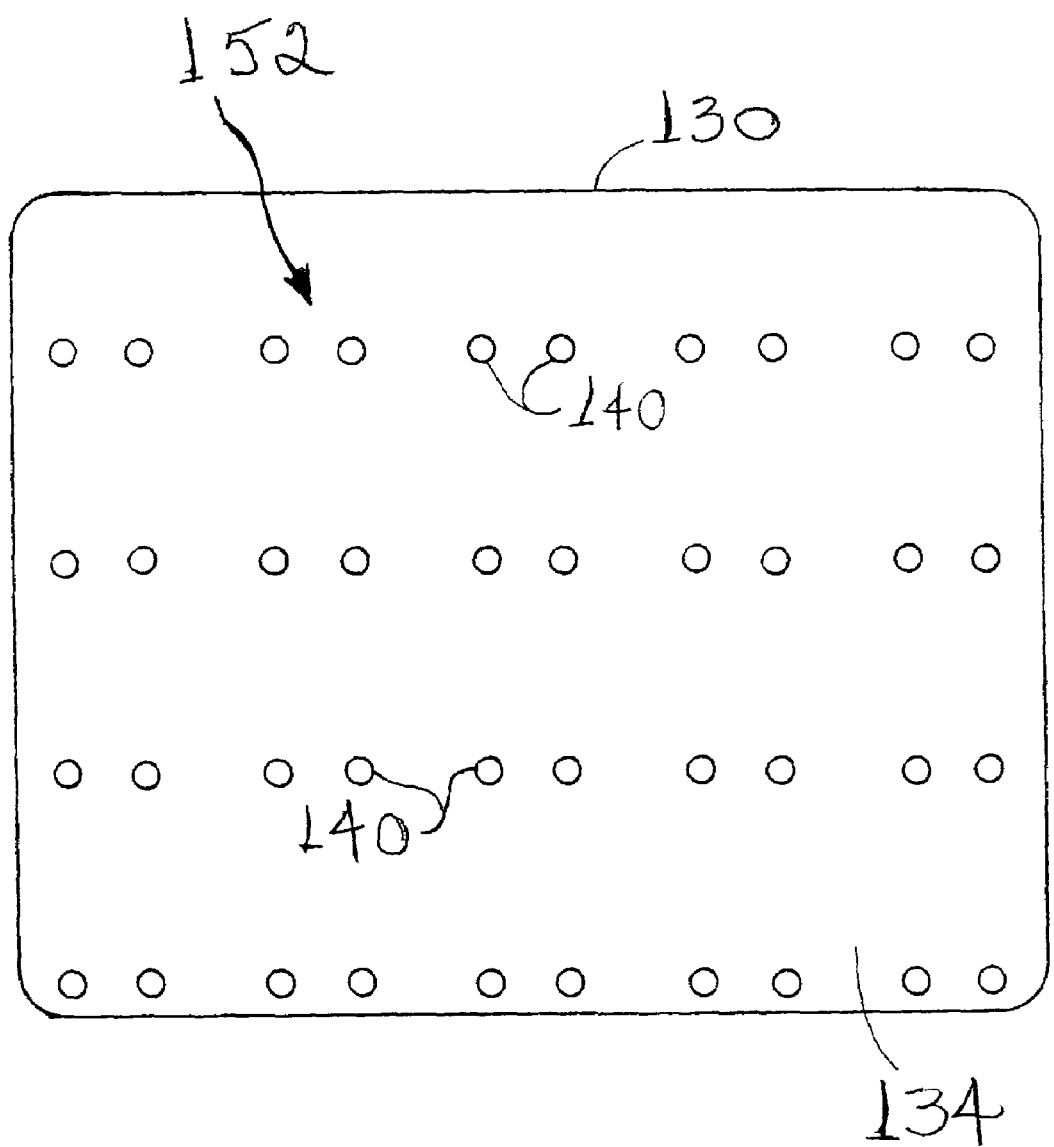
FIG. 8C is a schematic illustrating the I/O contact pattern on the readout surface of the exemplary semiconductor readout substrate of FIG. 8A.

Additionally, the ASIC readout substrate 130 comprises a plurality of electrical I/O contacts 140 processed on the readout surface 134 of the semiconductor readout substrate 130. The I/O contacts 140 are the input and output electrical contacts for the ASIC readout substrate 130 by which control, processing and imaging signals are communicated to the ASIC(s) of the readout substrate 130. The I/O contacts 140 are arranged in an I/O contact pattern 152 (see FIG. 8C).

Figure 9A:
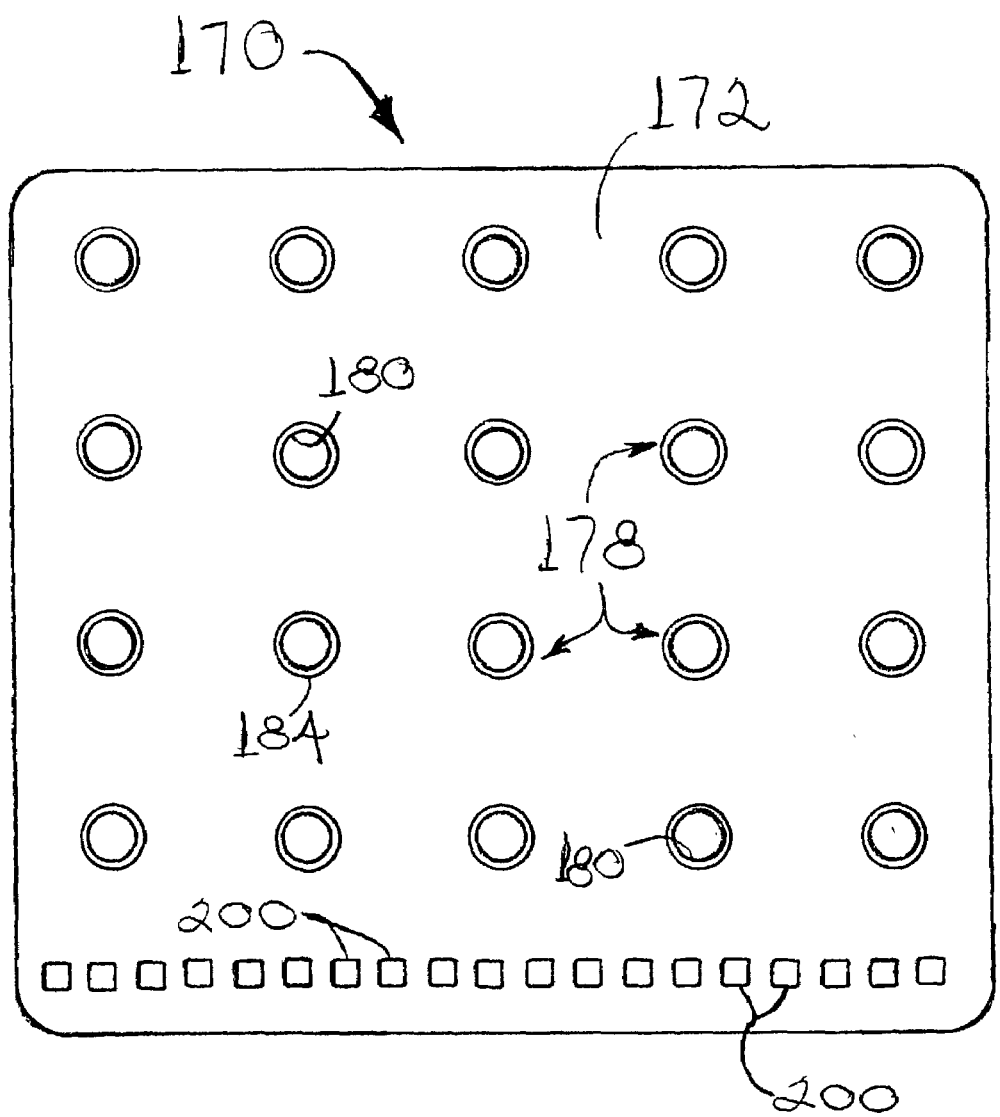
FIG. 9A is a schematic illustrating the entry face of an exemplary intermediate substrate, and showing via passage first ends having conductive skirts.
Figure 9B:
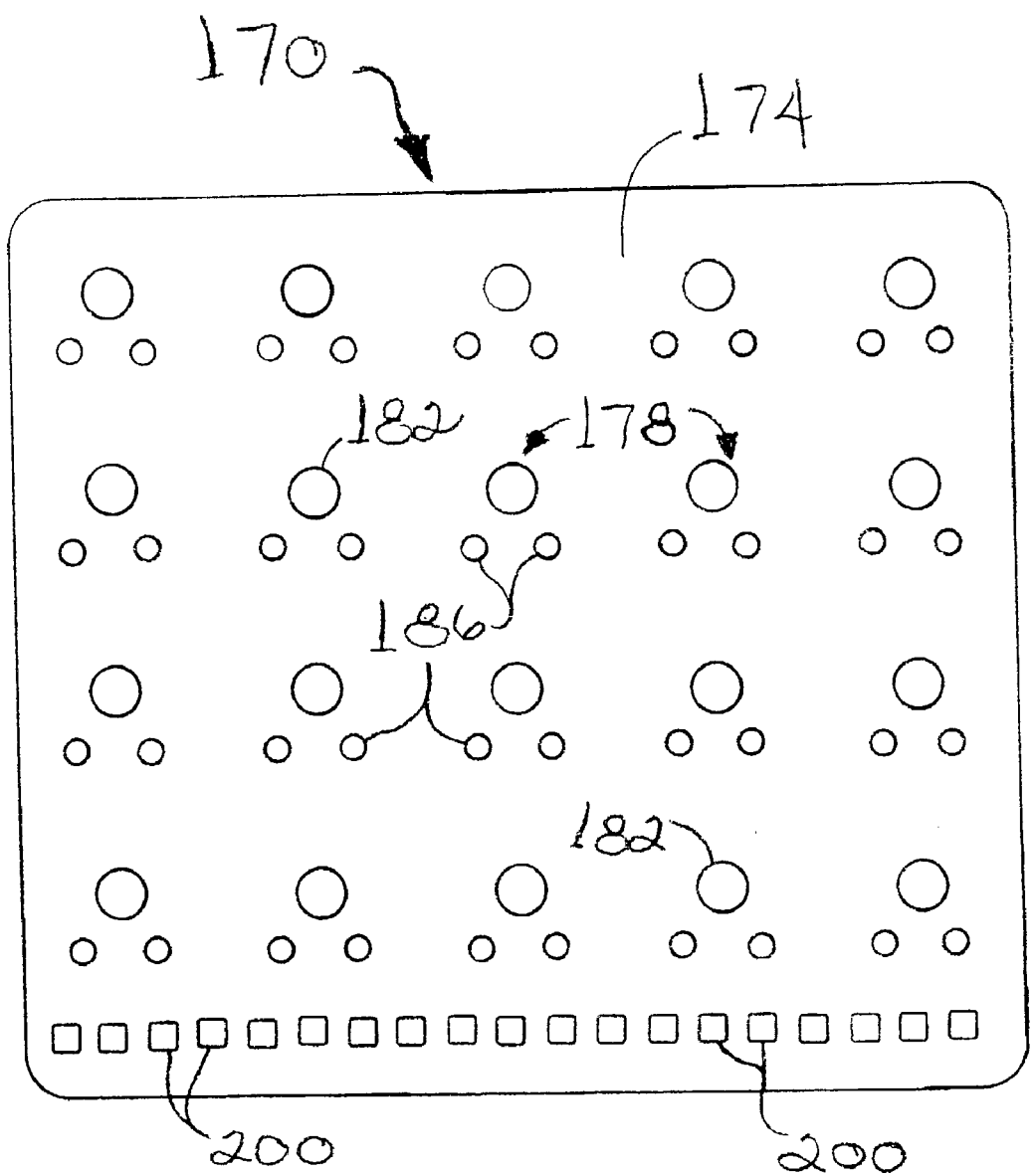
FIG. 9B is a schematic illustrating the exit face of an exemplary intermediate substrate, and showing via passage second ends without conductive skirts.

The intermediate substrate 170 is disposed between the detector substrate 90 and the ASIC readout substrate 130 (see FIGS. 5 and 6). As shown in FIGS. 9A and 9B, the intermediate substrate 170 has an entry face 172 and an exit face 174 (also see FIG. 6A). In the assembled SVCASIC imaging device 80, the entry face 172 is adjacent the pixel surface 94 of the detector substrate 90, and an exit face 174 is adjacent the readout surface 134 of the ASIC readout substrate 130. In a preferred embodiment, the intermediate substrate 170 is a printed circuit board (PC board). However, other embodiments of the intermediate substrate 170 are intended and are known to and practicable in the present imaging device 80 by one of skill in the art. These include: a photo-resist material, an FR4 material, and a ceramic material. Advantages of incorporating the intermediate substrate in the SVCASIC imaging device 80 include that it is easily produced, can be produced with several layers, and it provides a robust and mechanically stable platform on which to mount the semiconductor substrates 90 & 130.

The intermediate substrate 170 has a plurality of conductive via passages 178 which provide discrete, electrically conductive pathways between the entry and exit faces 172 & 174 of the intermediate substrate 170. Preferably, the via passages 178 are cylindrical. The via passages 178 have a first end 180 at the entry face 172 of the intermediate substrate 170, and a second end 182 at the exit face 174. The via passages 178 comprise a lining of an electrically conductive material to make the via passages 178 conductive. Preferably, the lining is made of Copper, but can be any electrically conductive material selectable by one of ordinary skill in the art from among such as: Gold, Silver, Nickel, Aluminum, Platinum, Lead, Tin, Bismuth and Indium. Alternatively, the via passages of the intermediate substrate 170 may be filled with an electrically conductive material (e.g., solder or a conductive adhesive, see below) to make the via passage conductive.

The via passage first ends 180 are arranged on the entry face 172 in an entry passage pattern (not shown) corresponding to the pixel contact pattern 104 (see FIG. 7B) on the pixel surface 94 of the detector substrate 90. The via passage second ends 182 are arranged on the exit face 174 in an exit passage pattern (not shown) corresponding to the transmission contact pattern 150 (see FIG. 8B) on the readout surface 134 of the ASIC readout/processing substrate 130. The via passage ends 180 & 182 are the conductive contacts of the via passages 178. Optionally, the via passages can include a discrete conductive skirt 184 at the via passage ends 180 & 182 on one or both faces 172 & 174 of the intermediate substrate 170 (see FIG. 9A). Additionally, the intermediate substrate 170 has a plurality of wire contacts 186 processed onto its exit face 174. The wire contacts 186 are arranged in a wire contact pattern (not shown) corresponding to the I/O contact pattern 152 (see FIG. 8C) on the readout surface 134 of the ASIC readout/processing substrate 130. The wire contacts 186 are in electrical communication with wire bonding pads 200 mounted or processed onto either or both of the faces 172 & 174 of the intermediate substrate 170.

Figure 10:
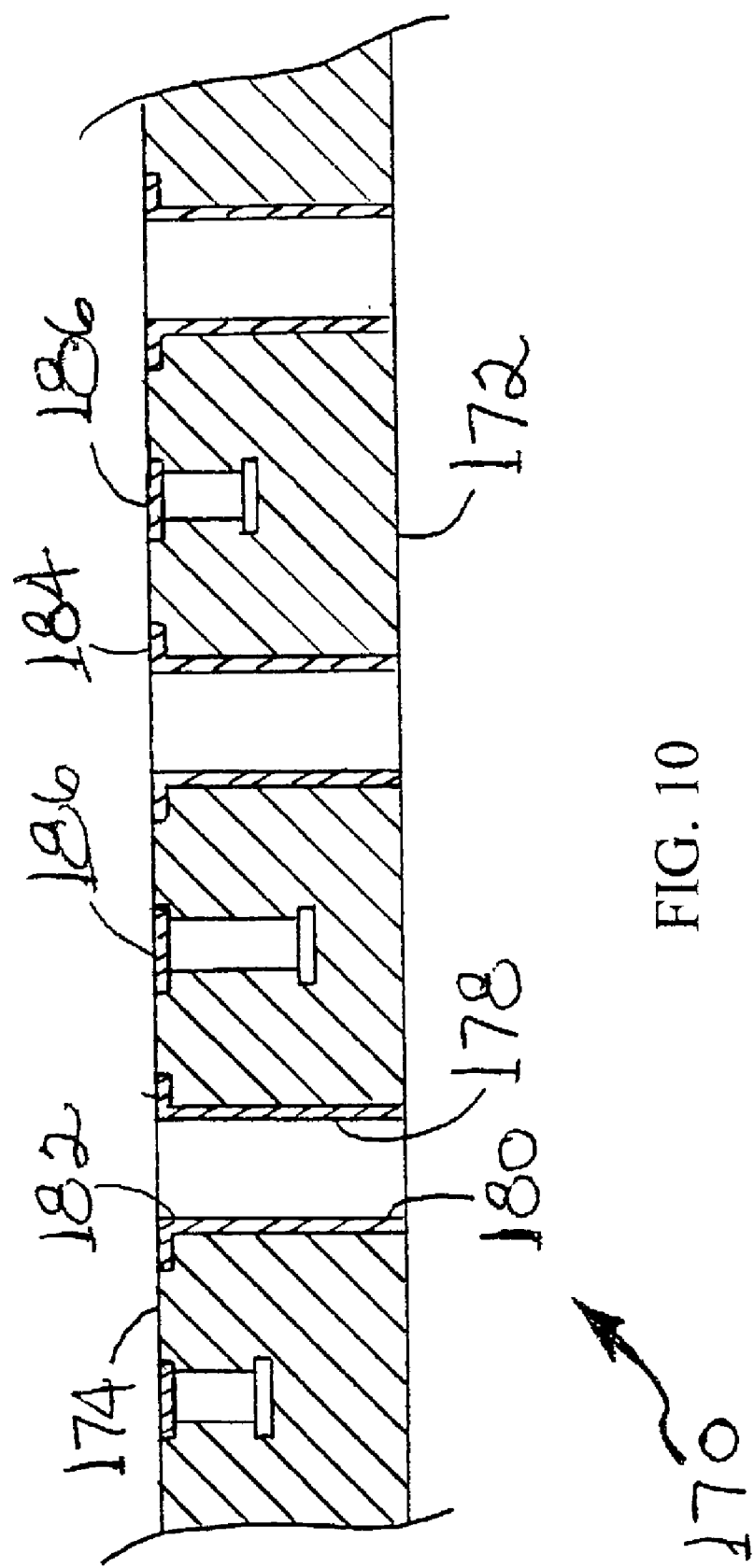
FIG. 10 is a cross sectional side view exemplifying of a portion of an intermediate substrate.

In the preferred embodiment shown in FIG. 10, the wire contacts 186 (and the via passage skirt 184) are recessed into the exit face 174 of the intermediate substrate 170, but alternatively, the wire contacts 186 (and the via passage skirt 184) could be on the exit face 174. The wire contacts 186 each are in electrical communication with a separate or a common wire bonding pad 200 by means of a circuit path 188. In the embodiment exemplified in FIG. 10, the circuit paths 188 are isolated from either face 172 & 174 of the intermediate substrate 170, and run within the layers of the intermediate substrate material (e.g., PC board). The circuit paths 188 do not have to all run at the same level within the layers of the intermediate substrate material, and can communicate with wire bonding pads 200 on either face of the intermediate substrate 130. This feature can be particularly beneficial when a conductive adhesive film is used to bond a semiconductor substrate to the intermediate substrate 170.

Electrically conductive bonds 220 discretely connect each conductive contact and with its corresponding conductive contact, i.e.: each pixel contact 102 in the pixel pattern 104 to the first end 180 of the corresponding conductive via passage 178 on the entry face 172 of the intermediate substrate 170, and each transmission contact 136 in the transmission contact pattern 150 is discretely connected to the second end 182 of the corresponding conductive via passage 178 of the exit face 174 of the intermediate substrate 170. Similarly, each I/O contact 140 in the I/O contact pattern 152 is conductively connected with the corresponding wire contact 186 on the intermediate substrate 170. In the preferred embodiment shown in FIG. 5, the electrically conductive bonds 220 comprise solder bump-bonds of any of a variety of solder alloys known in the art and selectable by the ordinary skilled artisan, including bump technologies such as stud bumps made of Au or Ag.

Alternatively, as shown in FIG. 6A, the electrically conductive bonds may comprise discrete conductive adhesive bonds 224. In this case, an appropriate conductive adhesive is discretely applied between the conductive contacts to be bonded to provide electrical continuity between the conductive contacts. A combination of conductive adhesive bonds 224 and solder bump-bonds 220 may be utilized to mount the semiconductor substrates 90 & 130 to the intermediate substrate in a SVCASIC imaging device 80, exemplified in FIG. 6A, where conductive adhesive bonds 224 join pixel contacts 102 to the via passages 178 of the intermediate substrate 170, and solder bump-bonds 220 join the pixel circuit contacts 140 to the via passages 178.

Also, anisotropically conductive adhesive films may be used to form conductive bonds 226 between the conductive contacts. The use of anisotropically conductive adhesives for forming conductive bonds is known in the art, as noted above. FIG. 6B exemplifies an embodiment of the present SVCASIC 80 practiced utilizing an anisotropically conductive film bond 226 to provide conductive bonds between pixel contacts on the pixel face 94 of the detector substrate 90, and the corresponding first ends 180 of the via passages 178 on the entry face 172 of the intermediate substrate 170. The anisotropically conductive film bond 226 also acts to mount the semiconductor detector substrate 90 to the intermediate substrate 170. Of course, conductive adhesive bump-bonds 224 and/or anisotropically conductive film bond 226 may be practiced between the either face of the intermediate substrate 130 and its corresponding semiconductor substrate surface.

Figure 11:
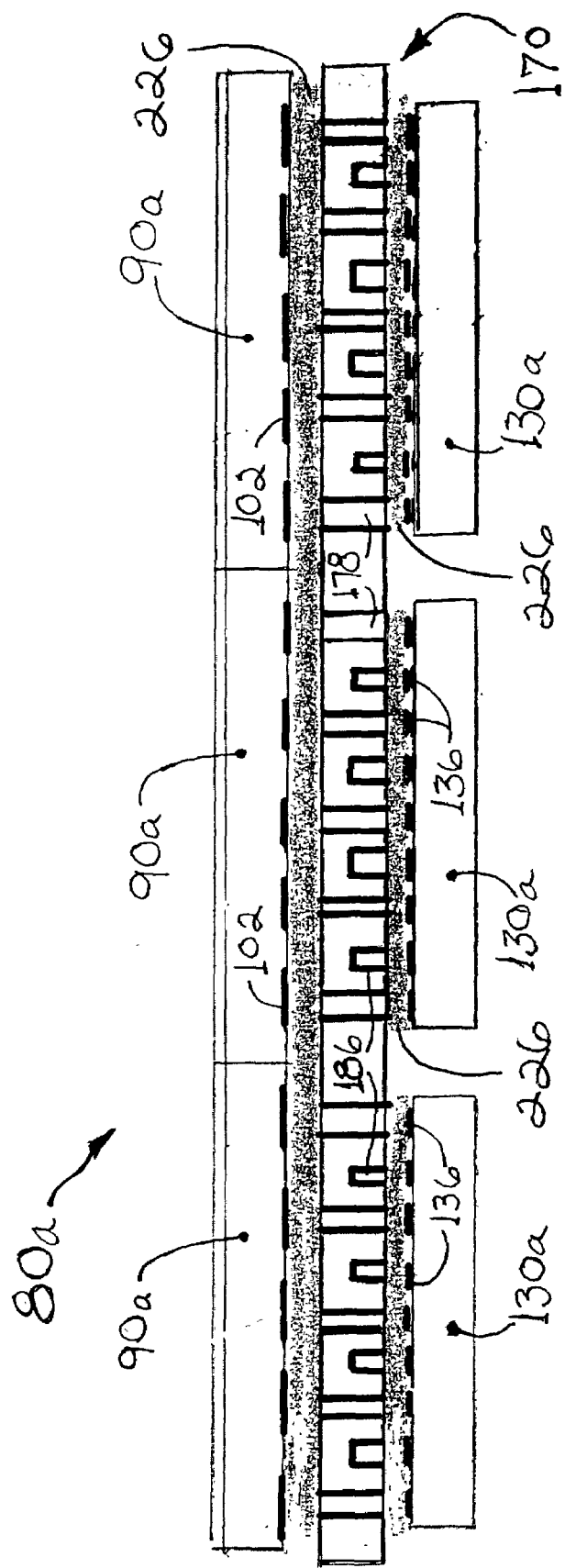
FIG. 11 is a side view schematic representation of a SVCASIC mosaic imaging device of the present invention showing the relationship between an array of detector and an array readout substrates to the single intermediate substrate. The intermediate substrate is in cross section to show the relationship of the various electrical contacts between the substrates.

In another preferred embodiment shown in FIG. 11, the present SVCASIC imaging device 80a comprising an array of a plurality of semiconductor detector substrates 90a and a corresponding array of a plurality of semiconductor ASIC readout substrates 130a which are separated by and bound to a single intermediate substrate 170 in a laminate-like configuration. Also see FIG. 5B. In the embodiment exemplified, the array of detector substrates 90a and the array of ASIC readout substrates 130a are mounted (bonded) to a single intermediate substrate 130 using an anisotropically conductive film 226. However, other means of appropriately bonding the semiconductor substrates 90a & 130a to the single intermediate substrate 130 are known to and practicable in the present invention by one of ordinary skill in the art, including such bonding means detailed above.

A method of producing a SVCASIC radiation energy imaging device 80/80a of the present invention is discernable to and practicable by one of ordinary skill in the art in view of the disclosure and figures herein. Generally, an intermediate substrate 170 and semiconductor readout substrate(s) 130/130a and detector substrate(s) 90/90a as described herein are provided. Conductive bonding means as also described herein are applied between corresponding conductive contacts on the substrates 90, 130 & 170, under proper conditions of temperature and pressure are caused to form conductive bonds between the corresponding conductive contacts, and to bond the substrates together in a laminate-like configuration to produce a SVCASIC radiation energy imaging device 80/80a of the present invention Advantages of the SVCASIC mosaic imaging device of this embodiment include: an imaging device having an enlarged, continuous imaging area without certain limitations of the tiling techniques described in the above prior art; the assembled SVCASIC mosaic imaging device is substantially planar (flat) and can be utilized like a "flat panel;" and detector substrates are abutted in both x and y directions minimizing imaging dead area; and the via passages in the intermediate substrate can serve as a "self aligning" feature for mounting the semiconductor substrates to the intermediate substrate.

While the above description contains many specifics, these should not be construed as limitations on the scope of the invention, but rather as exemplifications of one or another preferred embodiment thereof. Many other variations are possible, which would be obvious to one skilled in the art. Accordingly, the scope of the invention should be determined by the scope of the appended claims and their equivalents, and not just by the embodiments.

What is claimed is:

1. An x-ray and gamma-ray radiation energy imaging device comprising:
    a detector substrate, the detector substrate having an electrode surface and a pixel surface, and disposed to convert said radiation energy impinging on the electrode surface to electrical charges, with the electrode surface having a continuous contact electrode disposed thereon, and with the pixel surface having a plurality of pixel collector electrodes and associated pixel contacts thereon with the pixel collector electrodes for collecting the electrical charges and the pixel contacts disposed in a pixel contact pattern;
    an ASIC readout substrate consisting essentially of a plurality of pixel circuits, a readout surface disposed opposite the pixel surface of the detector substrate, the pixel circuits each having an electrical transmission contact processed on the readout surface in a transmission contact pattern, the transmission contacts being inputs to pixel circuits of the ASIC readout substrate, and a plurality of electrical I/O contacts processed on the readout surface in an I/O contact pattern, the I/O contacts being the input and output electrical contacts for the ASIC readout substrate;
    an intermediate substrate disposed between the detector substrate and the ASIC readout substrate, and having an entry face adjacent the pixel surface and an exit face adjacent the readout surface, a plurality of discrete conductive via passages, the passages having a first end at the entry face disposed in an entry passage pattern corresponding to the pixel pattern and a second end at the exit face disposed in an exit passage pattern corresponding to the transmission contact pattern, and a plurality of wire contacts on the exit face disposed in a wire contact pattern corresponding to the I/O contact pattern on the readout surface, the wire contacts being in electrical communication with wire bonding pads mounted on the intermediate substrate; and
    electrically conductive bonds discretely connecting each pixel contact in the pixel pattern to the first end of the corresponding conductive via passage of the entry passage pattern, and connecting each transmission contact in the transmission contact pattern to the second end of the corresponding conductive via passage of the exit passage pattern to provide the through massage of collected electrical charges of the pixel contacts through the intermediate substrate directly to the corresponding transmission contacts on the ASIC readout substrate, and connecting each I/O contact in the I/O contact pattern with the corresponding wire contact in the wire contact pattern on the intermediate substrate to route substantially all input and output communications to the ASIC readout substrate through the intermediate substrate.

2. The radiation energy imaging device of claim 1, wherein the detector substrate is a temperature sensitive, compound semiconductor substrate.

3. The radiation energy imaging device of claim 1, wherein the detector substrate comprises an element selected from the group consisting of Cadmium and Tellurium.

4. The radiation energy imaging device of claim 1, wherein the intermediate substrate has the wire contacts recessed into the exit face of the intermediate substrate.

5. The radiation energy imaging device of claim 1, wherein the intermediate substrate has conductive via passages having a lining comprised of an electrically conductive material to make the passage conductive.

6. The intermediate substrate of claim 5, wherein the conductive via passages have a lining comprised of an electrically conductive material selected from the group consisting of Copper, Gold, Silver, Nickel, Aluminum, Platinum, Lead, Tin, Bismuth and Indium.

7. The intermediate substrate of claim 5, wherein the intermediate substrate further comprises a component selected from the group consisting of: a printed circuit board, a component made of a photo-resist material, a component made of an FR4 material, and a component made of a ceramic material.

8. The radiation energy imaging device of claim 1, wherein the intermediate substrate has conductive via passages that are filled with an electrically conductive material to make the passage conductive.

9. The intermediate substrate of claim 5, wherein the conductive via passages each electrically communicates with a discrete conductive skirt at the end of passage on at least one of the faces of the intermediate substrate.

10. The radiation energy imaging device of claim 1, wherein the electrically conductive bonds comprise bump-bonds.

11. The radiation energy imaging device of claim 1, wherein the electrically conductive bonds comprise solder bump-bonds.

12. The radiation energy imaging device of claim 1, wherein the electrically conductive bonds comprise a conductive adhesive.

13. The radiation energy imaging device of claim 1, wherein the electrically conductive bonds comprise an anisotropically conductive adhesive.

14. The radiation energy imaging device of claim 1, comprising a plurality of detector substrates, a plurality of ASIC readout substrates bonded to a single intermediate substrate.

15. An x-ray and gamma-ray radiation energy imaging device comprising:
    a semiconductor detector substrate and a semiconductor readout/processing substrate both mounted on opposite sides of an intermediate substrate, the intermediate substrate through communicating all electrical signals from the detector substrate directly to the readout/processing substrate, the substrates all being substantially planar, with the readout/processing substrate and the detector substrate each having a perimeter, the readout/processing substrate perimeter falling within the shadow of the detector substrate perimeter of the corresponding detector substrate with which it electrically communicates, and the readout/processing substrate having circuitry contacts all of which circuitry contacts are disposed on a surface of the semiconductor readout/processing substrate that electrically communicates with the intermediate substrate, and substantially all electrical communication to and from the semiconductor readout/processing substrate being routed through the intermediate substrate by way of the circuitry contacts.

16. A method of producing a radiation energy imaging device of claim 1 comprising the steps of:
    providing an intermediate substrate having an entry face and an exit face, a plurality of discrete conductive via passages having two ends, a first end at the entry face disposed in an entry passage pattern corresponding to a pixel pattern of a detector substrate and a second end at the exit face disposed in an exit passage pattern corresponding to a transmission contact pattern of a readout substrate, and a plurality of wire contacts on the exit face disposed in a wire contact pattern corresponding to the I/O contact pattern of a readout substrate, the wire contacts being in electrical communication with wire bonding pads mounted on the intermediate substrate;
    applying conductive bumps to the conductive via passages and any wire contacts on a face of the intermediate substrate to provide an intermediate substrate face with solder bumped contacts;
    positioning an appropriate semiconductor substrate in juxtaposition with the intermediate substrate face with solder bumped contacts, with the solder bumped contacts closely proximate the corresponding contacts on the semiconductor substrate; and
    causing the conductive bumped contacts to bond under appropriate conditions of heat and pressure and to farm bump-bonds between the conductive bumped contacts of the intermediate substrate and the corresponding contacts on the semiconductor substrate to produce the radiation energy imaging device of claim 1.

17. A method of producing a radiation energy imaging device of claim 16, wherein the applying step and the positioning step comprise:
    applying conductive bumps to the conductive contacts and any wire contacts on a face of a semiconductor substrate to provide a semiconductor substrate face with solder bumped contacts; and
    positioning the semiconductor substrate face with conductive bumped contacts in juxtaposition with an appropriate intermediate substrate face of the intermediate substrate, with the conductive bumped contacts closely proximate the corresponding contacts on the appropriate intermediate substrate face.

18. A method of producing a radiation energy imaging device of claim 1 comprising the steps of:
    providing an intermediate substrate having an entry face and an exit face, a plurality of discrete conductive via passages having two ends, a first end at the entry face disposed in an entry passage pattern corresponding to a pixel pattern of a detector substrate and a second end at the exit face disposed in an exit passage pattern corresponding to a transmission contact pattern of a readout substrate, and a plurality of wire contacts on the exit face disposed in a wire contact pattern corresponding to the I/O contact pattern of a readout substrate, the wire contacts being in electrical communication with wire bonding pads mounted on the intermediate substrate;
    applying a conductive adhesive to the conductive via passages and any wire contacts on a face of the intermediate substrate to provide an intermediate substrate face with conductive adhesive coated contacts; positioning an appropriate semiconductor substrate in juxtaposition with the intermediate substrate face with the conductive adhesive coated contacts, and with the conductive adhesive coated contacts closely proximate the corresponding contacts on the semiconductor substrate; and
    causing the conductive adhesive of the conductive adhesive coated contacts under appropriate conditions of heat and pressure to conductively adhere the contacts of the intermediate substrate to the corresponding contacts on the semiconductor substrate to produce the radiation energy imaging device of claim 1.

19. A method of producing a radiation energy imaging device of claim 18, wherein the applying step and the positioning step comprise:
    applying a conductive adhesive to the conductive contacts and any wire contacts on a face of a semiconductor substrate to provide a semiconductor substrate face with conductive adhesive coated contacts; and
    positioning the semiconductor substrate face with the conductive adhesive coated contacts in juxtaposition with an appropriate intermediate substrate face of the intermediate substrate, with the conductive adhesive coated contacts closely proximate the corresponding contacts on the appropriate intermediate substrate face.

20. A method of producing a radiation energy imaging device of claim 18, wherein the conductive adhesive is an anisotropically conductive adhesive.

* * * * *